United States Patent
Lin et al.

(10) Patent No.: US 12,266,421 B2
(45) Date of Patent: Apr. 1, 2025

(54) MEMORY DEVICE OF REDUCING THE NUMBER OF CALIBRATION RESISTORS AND CONTROL METHOD THEREOF

(71) Applicant: Realtek Semiconductor Corp., HsinChu (TW)

(72) Inventors: Wen-Wei Lin, HsinChu (TW); Ching-Sheng Cheng, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 131 days.

(21) Appl. No.: 18/116,823

(22) Filed: Mar. 2, 2023

(65) Prior Publication Data
US 2024/0071432 A1   Feb. 29, 2024

(30) Foreign Application Priority Data
Aug. 26, 2022 (TW) ................................ 111132304

(51) Int. Cl.
*G11C 7/10* (2006.01)

(52) U.S. Cl.
CPC .... *G11C 7/1048* (2013.01); *G11C 2207/2254* (2013.01)

(58) Field of Classification Search
CPC .......... G11C 7/1048; G11C 2207/2254; G11C 29/028; G11C 29/022; G11C 7/1066; G11C 7/1093; G06F 13/1621
See application file for complete search history.

(56) References Cited

U.S. PATENT DOCUMENTS

| | | | |
|---|---|---|---|
| 2014/0241082 A1* | 8/2014 | Tam | G11C 7/222 365/194 |
| 2016/0042769 A1* | 2/2016 | Moran | G11C 5/066 711/105 |

* cited by examiner

*Primary Examiner* — Jay W. Radke
(74) *Attorney, Agent, or Firm* — Winston Hsu

(57) ABSTRACT

A memory device includes a resistor and a controller chip. The controller chip includes a first controller, a second controller, a first set of input/output (I/O) circuits, a second set of I/O circuits, a first calibration circuit, a second calibration circuit, and an arbitration circuit. The first controller transmits a first controller calibration request. The second controller transmits a second controller calibration request. The arbitration circuit instructs the first calibration circuit to perform a first controller calibration on the first set of I/O circuits using the resistor in response to the first controller calibration request, and instructs the second calibration circuit to perform a second controller calibration on the second set of I/O circuits using the resistor in response to the second controller calibration request. A first time interval of performing the first controller calibration and a second time interval of performing the second controller calibrations are non-overlapping.

10 Claims, 4 Drawing Sheets

MEMORY DEVICE OF REDUCING THE NUMBER OF CALIBRATION RESISTORS AND CONTROL METHOD THEREOF

BACKGROUND OF THE INVENTION

1. Field of the Invention

The present invention relates to a memory device, and in particular, to a memory device of reducing the number of calibration resistors used and a control method thereof.

2. Description of the Prior Art

Memory chips employ output drivers and termination resistors to drive and receive signals for improving signal integrity and enhancing signal strength. However, since the driving strengths of the output drivers and the resistances of the termination resistors in the memory chip can be affected by process, voltage and temperature variation, it is necessary to regularly calibrate the output drivers and the termination resistors to ensure the signal quality. ZQ calibration is a calibration method for adjusting the driving strengths of the output drivers and the resistances of the terminal resistors of the memory chip, in which a precision ZQ resistor external to the memory chip is used to calibrate the driving strengths of the output drivers and the resistances of the terminal resistors in a memory chip.

In the conventional ZQ calibration, each memory chip and each controller chip must be equipped with an independent ZQ resistor, resulting in increases in the circuit area and the manufacturing cost.

SUMMARY OF THE INVENTION

According to an embodiment of the invention, a memory device includes a resistor and a controller chip. The resistor is coupled between a connection terminal and a ground terminal. The controller chip includes a first controller, a second controller, a first set of input/output (I/O) circuits, a second set of I/O circuits, a first calibration circuit, a second calibration circuit, and an arbitration circuit. The first controller is configured to transmit a first controller calibration request. The second controller is configured to transmit a second controller calibration request. The first set of I/O circuits is coupled to the first controller. The second set of I/O circuits is coupled to the second controller. The first calibration circuit is coupled to the connection terminal and the first set of I/O circuits, and is configured to perform a first controller calibration of the first set of I/O circuits using the resistor. The second calibration circuit is coupled to the connection terminal and the second set of I/O circuits, and is configured to perform a second controller calibration of the second set of I/O circuits using the resistor. The arbitration circuit is coupled to the first controller, the second controller, the first calibration circuit and the second calibration circuit, and is configured to instruct the first calibration circuit to perform a first controller calibration on the first set of I/O circuits in response to the first controller calibration request, and instruct the second calibration circuit to perform a second controller calibration on the second set of I/O circuits in response to the second controller calibration request. A first time interval of performing the first controller calibration and a second time interval of performing the second controller calibrations are non-overlapping.

According to another embodiment of the invention, a memory device includes a resistor and a controller chip, the resistor is coupled between a connection terminal and a ground terminal, and the controller chip includes a first controller, a second controller, a first set of I/O circuits, a second set of I/O circuits, a first calibration circuit, a second calibration circuit and an arbitration circuit. The first set of I/O circuits is coupled to the first controller, the second set of I/O circuits is coupled to the second controller, the first calibration circuit is coupled to the connection terminal and the first set of I/O circuits, the second calibration circuit is coupled to the connection terminal and the second set of I/O circuits, and the arbitration circuit is coupled to the first controller, the second controller, the first calibration circuit and the second calibration circuit. A method of controlling the memory device includes the first controller transmitting a first controller calibration request, the second controller transmitting a second controller calibration request, and the arbitration circuit instructing the first calibration circuit to perform a first controller calibration on the first set of I/O circuits using the resistor in response to the first controller calibration request, and instructing the second calibration circuit to perform a second controller calibration on the second set of I/O circuits using the resistor in response to the second controller calibration request, wherein a first period of the first calibration circuit performing the first controller calibration and a second period of the second calibration circuit performing the second controller calibration are non-overlapping.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
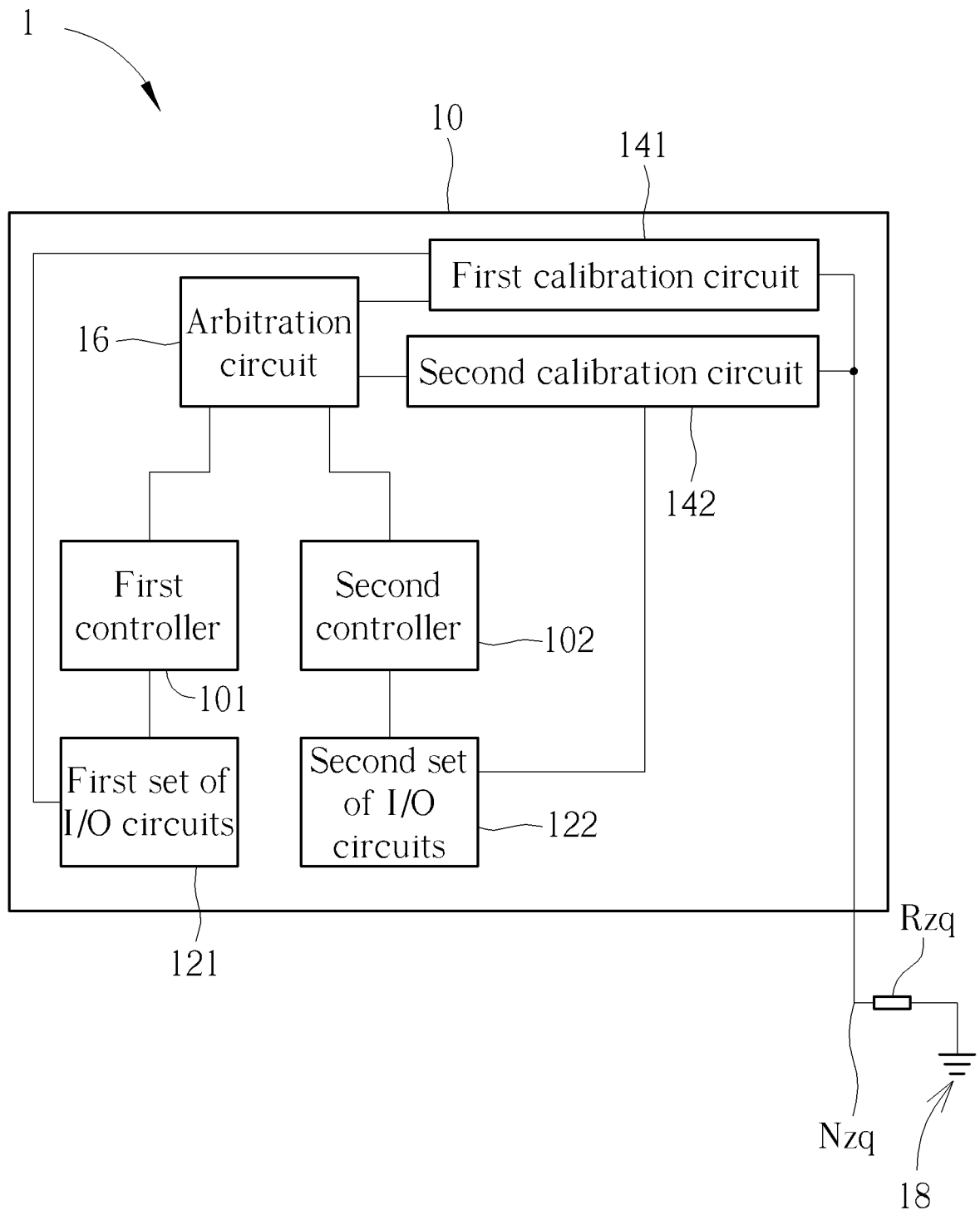
FIG. 1 is a schematic diagram of a memory device according to an embodiment of the invention.

FIG. 1 is a schematic diagram of a memory device 1 according to an embodiment of the invention. The memory device 1 includes a resistor Rzq and a controller chip 10 coupled to each other. The resistor Rzq is a precision resistor of 240 ohms located outside the controller chip 10. The controller chip 10 may include a plurality of controllers encapsulated in a single package. The input/output (I/O) circuits of these controllers may share the resistor Rzq to calibrate output drivers and termination resistors. Since the controllers may share the resistor Rzq, the number of the resistors Rzq in the memory device 1 may be reduced, thereby reducing the circuit area and the manufacturing cost.

The resistor Rzq is coupled between the connection terminal Nzq and the ground terminal 18. The controller chip 10 may include a first controller 101, a second controller 102, a first set of I/O circuits 121, a second set of I/O circuits 122, a first calibration circuit 141, a second calibration circuit 142, and an arbitration circuit 16. The arbitration circuit 16 may be coupled to the first controller 101, the second controller 102, the first calibration circuit 141 and the second calibration circuit 142. The first set of I/O circuits 121 may be coupled to the first controller 101 and the first calibration circuit 141. The second set of I/O circuits 122 may be coupled to the second controller 102 and the second calibration circuit 142. The first calibration circuit 141 and the second calibration circuit 142 may be further coupled to the resistor Rzq via a connection terminal Nzq.

The first set of I/O circuits 121 may include a set of I/O circuits for clock signals, data signals, data strobe signals, control signals and address signals of the first controller 101, the second set of I/O circuits 122 may include a set of I/O circuits for clock signals, data signals, data strobe signals, control signals and address signals of the second controller 102, and each I/O circuit may include an output driver and a termination resistor. The first set of I/O circuits 121 and the second set of I/O circuits 122 may be disposed at different locations of the controller chip 10 separately. For example, the first set of I/O circuits 121 may be disposed at the top portion of the controller chip 10, the second set of I/O circuits 122 may be disposed at the bottom portion of the controller chip 10.

The first calibration circuit 141 may perform a first controller calibration of the first set of I/O circuits 121 using the resistor Rzq to generate a calibrated driving strength of the output driver and calibrated resistance of the termination resistor for each I/O circuit in the first set of I/O circuits 121. The second calibration circuit 142 may perform a second controller calibration of the second set of I/O circuits 122 using the resistor Rzq to generate a calibrated driving strength of the output driver and calibrated resistance of the termination resistor for each I/O circuit in the second set of I/O circuits 122. The first calibration circuit 141 and the second calibration circuit 142 may share the resistor Rzq to perform the calibrations of the output drivers and the termination resistors of the first set of I/O circuits 121 and the second set of I/O circuits 122.

Prior to performing the first controller calibration, the first controller 101 may transmit a first controller calibration request to the arbitration circuit 16. Prior to performing the second controller calibration, the second controller 102 may transmit a second controller calibration request to the arbitration circuit 16. The arbitration circuit 16 may transmit a first controller calibration acknowledgement to the first calibration circuit 141 in response to the first controller calibration request, thereby instructing the first calibration circuit 141 to perform the first controller calibration, and transmit a second controller calibration acknowledgement to the second calibration circuit 142 in response to the second controller calibration request, thereby instructing the second calibration circuit 142 to perform the second controller calibration. A first period during which the first calibration circuit 141 performs the first controller calibration and a second period during which the second calibration circuit 142 performs the second controller calibration are non-overlapping.

The arbitration circuit 16 may receive the first controller calibration request and the second controller calibration request, and perform the first controller calibration and the second controller calibration on the basis of time-division. In some embodiments, the arbitration circuit 16 may receive the second controller calibration request during the first period, and instruct the second calibration circuit 142 to perform the second controller calibration in response to the second controller calibration request upon completion of the first period. Similarly, the arbitration circuit 16 may receive the first controller calibration request during the second period, and instruct the first calibration circuit 141 to perform the first controller calibration in response to the first controller calibration request upon completion of the second period. In other embodiments, the arbitration circuit 16 may receive the second controller calibration request after the first period, and instruct the second calibration circuit 142 to perform the second controller calibration in response to the second controller calibration request. Similarly, the arbitration circuit 16 may receive the first controller calibration request after the second period, and instruct the first calibration circuit 141 to perform the first controller calibration in response to the first controller calibration request. In other embodiments, the arbitration circuit 16 may receive the first controller calibration request and the second controller calibration request at the same time, and instruct the first calibration circuit 141 according to the priority order of the first controller 101 and the second controller 102 and one of the second calibration circuits 142 to perform calibration, and instruct the other of the first calibration circuit 141 and the second calibration circuit 142 to perform calibration after the first calibration is completed. For example, the priority of the first controller 101 may be higher than that of the second controller 102. When receiving both the first controller calibration request and the second controller calibration request at the same time, the arbitration circuit 16 may first instruct the first calibration circuit 141 to perform the first controller calibration in response to the first controller calibration request, and after the first period, continue to instruct the second calibration circuit 142 to perform the second controller calibration in response to the second controller calibration request.

The arbitration circuit 16 may determine whether the first period is completed and whether the second period is completed. In some embodiments, the length of the first period and the length of the second period may be equal to a predetermined time length, and the arbitration circuit 16 may determine that the first period is completed after a predetermined period of time following transmitting the first controller calibration acknowledgement to the first calibration circuit 141, and determine that the second period is completed after the predetermined period of time following transmitting the second controller calibration acknowledgement to the second calibration circuit 142. In other embodiments, the first calibration circuit 141 may report the time required for the first controller calibration to the arbitration circuit 16 after receiving the first controller calibration acknowledgement (i.e., the instruction to perform the first controller calibration), and the arbitration circuit 16 may determine that the first period is completed after the time required for the first controller calibration following transmitting the first controller calibration acknowledgement to the first calibration circuit 141. Similarly, the second calibration circuit 142 may report the time required for the second controller calibration to the arbitration circuit 16 after receiving the second controller calibration acknowledgement (i.e., the instruction to perform the second controller calibration), and the arbitration circuit 16 may determine that the second period is completed after the time required for the second controller calibration following transmitting the second controller calibration acknowledgement to the second calibration circuit 142.

Figure 2:
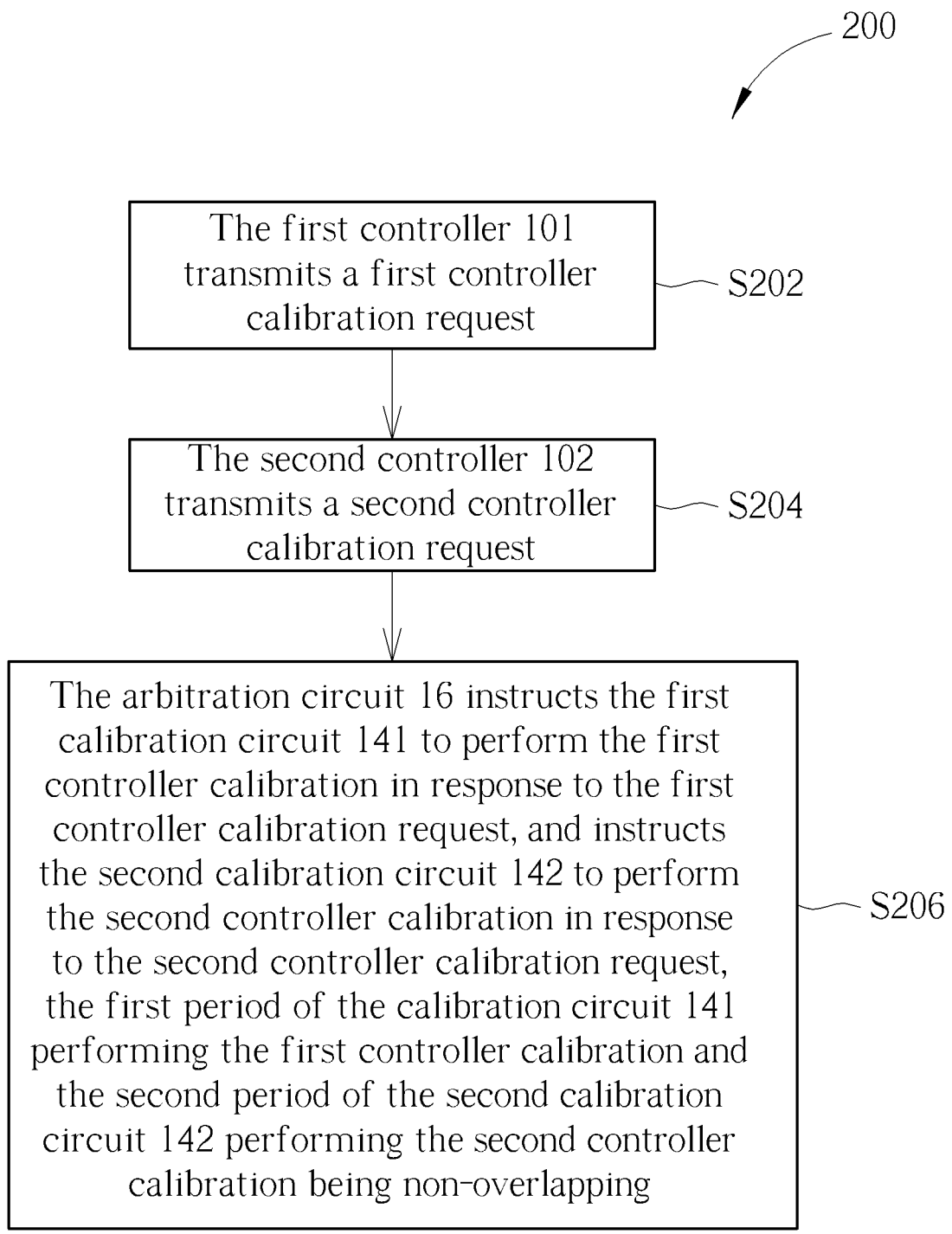
FIG. 2 is a flowchart of a control method of the memory device in FIG. 1.

FIG. 2 is a flowchart of a control method 200 of the memory device 1. The control method 200 includes Steps S202 to S206 to perform a plurality of calibrations on the basis of time-division. Any reasonable step change or adjustment is within the scope of the present disclosure. Steps S202 to S206 are detailed as follows:

Step S202: The first controller 101 transmits a first controller calibration request;

Step S204: The second controller 102 transmits a second controller calibration request;

Step S206: The arbitration circuit 16 instructs the first calibration circuit 141 to perform the first controller calibration in response to the first controller calibration request, and instructs the second calibration circuit 142 to perform the second controller calibration in response to the second controller calibration request, the first period of the calibration circuit 141 performing the first controller calibration and the second period of the second calibration circuit 142 performing the second controller calibration being non-overlapping.

The details of Steps S202 to S210 have been explained in the preceding paragraphs, and will not be repeated here for brevity.

Figure 3:
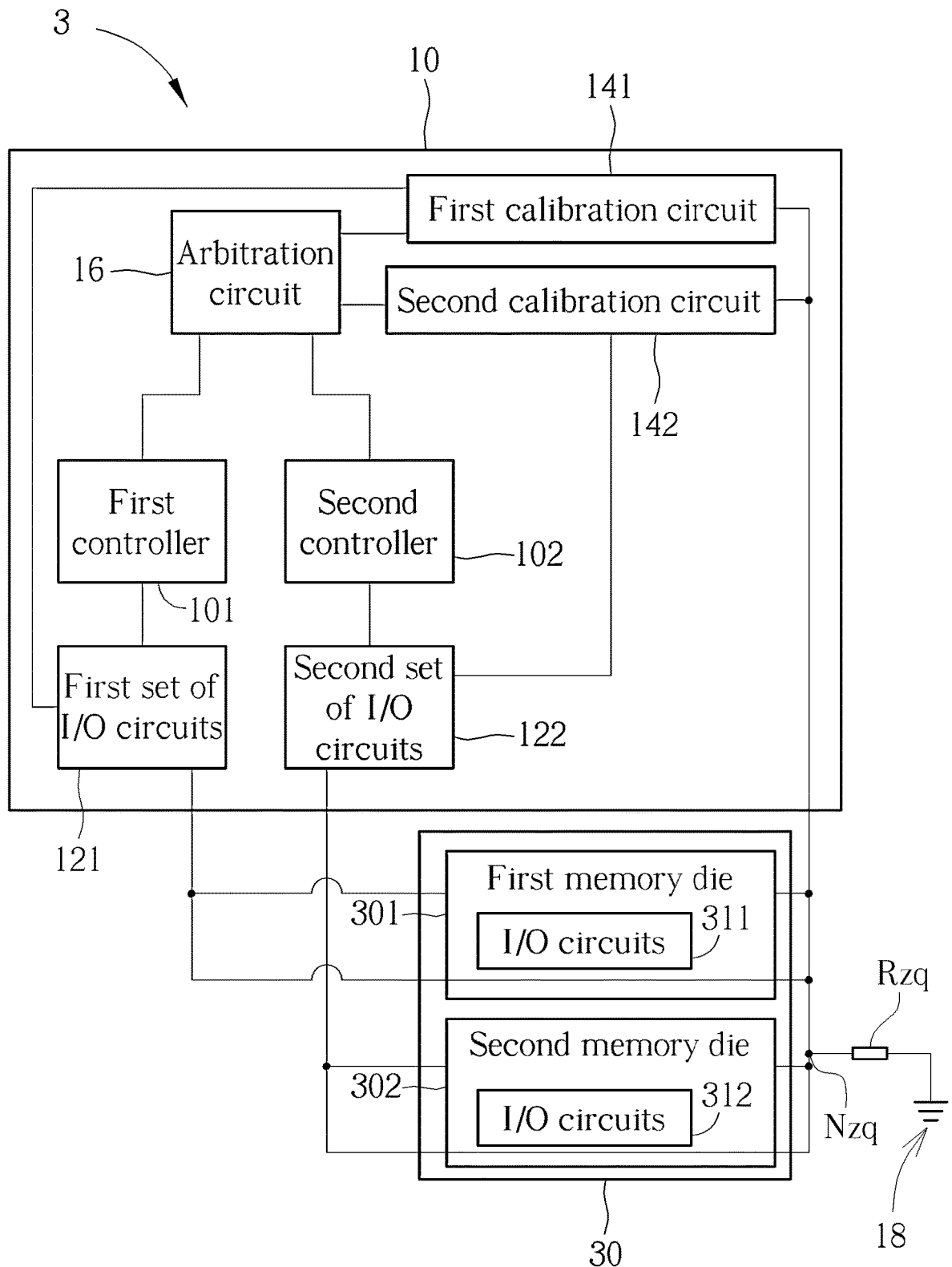
FIG. 3 is a schematic diagram of a memory device according to another embodiment of the invention.

FIG. 3 is a schematic diagram of a memory device 3 according to another embodiment of the invention. The difference between the memory device 3 and the memory device 1 lies in that the memory device 3 further includes a memory chip 30. Explanations for the memory chip 30 will be provided in the following paragraphs, and the explanation of the calibration of the controller chip 10 can be found in the preceding paragraphs, and will not be repeated here.

The memory chip 30 may be coupled to the first set of I/O circuits 121, the second set of I/O circuits 122 and a connection terminal Nzq. The memory chip 30 may include a first memory die 301 and a second memory die 302, and the I/O circuits 311 of the first memory die 301 and the I/O circuits 312 of the second memory die 302 may share the resistor Rzq for the calibrations of the output drivers and the termination resistors thereof. Since the resistor Rzq may be shared, the number of the resistor Rzq in the memory device 3 may be reduced, thereby reducing the circuit area and the manufacturing cost. The first memory die 301 may include a third-generation double data rate 3 random-access memory (DDR3 RAM). The second memory die 302 may include a fourth-generation double data rate 3 random-access memory (DDR4 RAM). The first memory die 301 and the second memory die 302 may be of the same or different types of memories.

The first memory die 301 may be coupled to the connection terminal Nzq and the first set of I/O circuits 121, and the resistor Rzq may be used to perform a first memory calibration of the first memory die 301. The second memory die 302 may be coupled to the connection terminal Nzq and the second set of I/O circuits 122, and may use the resistor Rzq to perform a second memory calibration of the second memory die 302. Specifically, the first memory calibration is performed on the I/O circuits 311 of the first memory die 301 using the shared resistor Rzq, and the second memory calibration is performed on the I/O circuits 312 of the second memory die 302 using the shared resistor Rzq.

Prior to performing the first memory calibration, the first memory die 301 may transmit a first memory calibration request to the arbitration circuit 16 via the first set of I/O circuits 121 and the first controller 101. Prior to performing the second memory calibration, the second memory die 302 may transmit a second memory calibration request to the arbitration circuit 16 via the second set of I/O circuits 122 and the second controller 102.

The arbitration circuit 16 may receive two or more first controller calibration requests, the second controller calibration requests, the first memory calibration requests, and the second memory calibration requests, and perform the corresponding two or more calibrations according to the time-division-based calibration method outlined in the preceding paragraphs. For example, the arbitration circuit 16 may instruct the first calibration circuit 141 to perform the first controller calibration in a first period in response to the first controller calibration request, instruct the second calibration circuit 142 to perform the second controller calibration in a second period in response to the second controller calibration request, instruct the first memory die 301 via the first controller 101 and the first set of I/O circuits 121 to perform the first memory calibration in a third period in response to the first memory calibration request, and/or instruct the second memory die 302 via the second controller 102 and the second first set of I/O circuits 122 to perform the second memory calibration in a fourth period in response to the second memory calibration request, the first to the fourth periods being non-overlapping.

Figure 4:
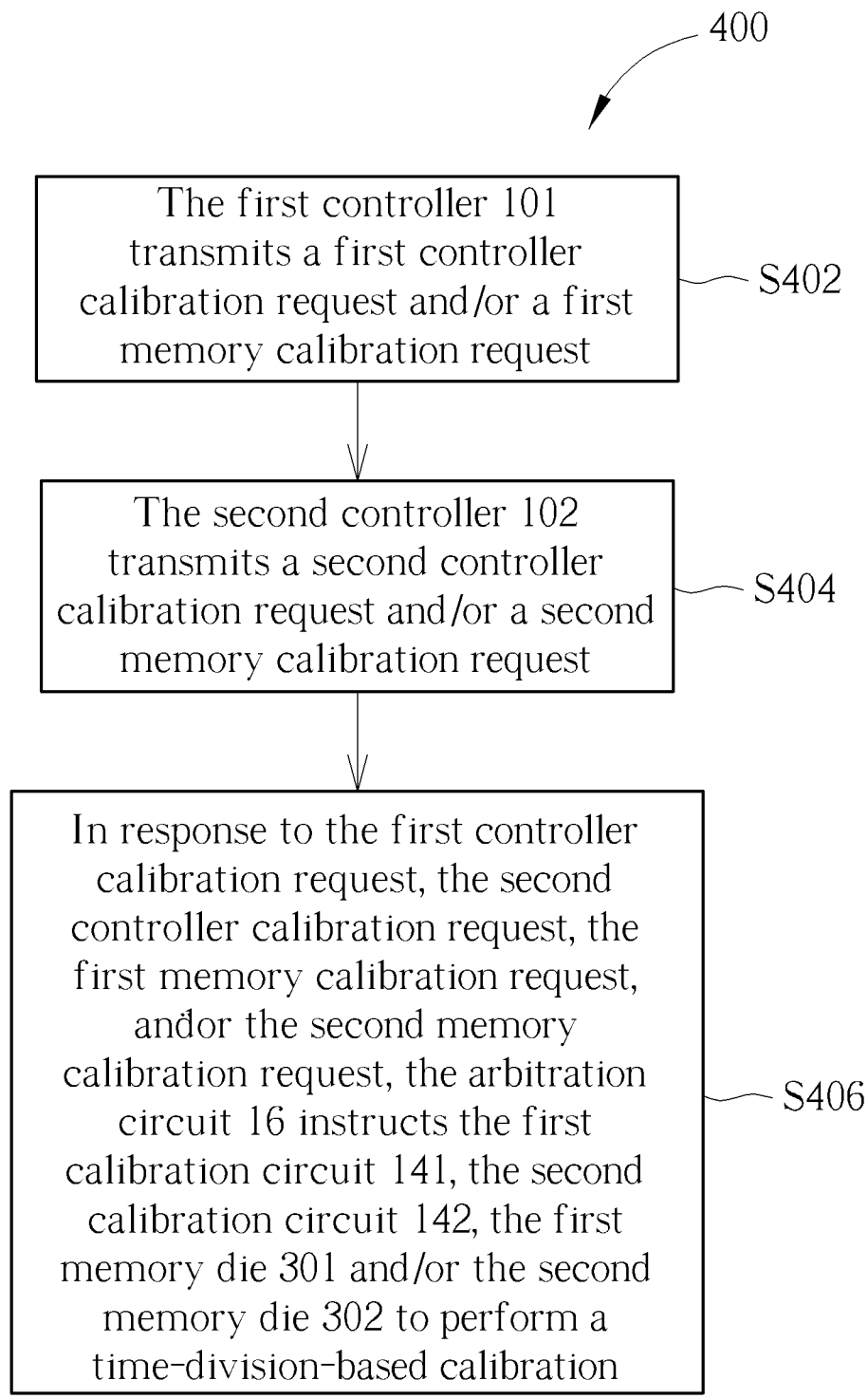
FIG. 4 is a flowchart of a control method of the memory device in FIG. 3.

FIG. 4 is a flowchart of a control method 400 of the memory device 3. The control method 400 includes Steps S402 to S406 to perform a plurality of calibrations on the basis of time-division. Any reasonable step change or adjustment is within the scope of the present disclosure. Steps S402 to S406 are detailed as follows:

Step S402: The first controller 101 transmits a first controller calibration request and/or a first memory calibration request;

Step S404: The second controller 102 transmits a second controller calibration request and/or a second memory calibration request;

Step S406: In response to the first controller calibration request, the second controller calibration request, the first memory calibration request, and/or the second memory calibration request, the arbitration circuit 16 instructs the first calibration circuit 141, the second calibration circuit 142, the first memory die 301 and/or the second memory die 302 to perform a time-division-based calibration.

The explanations of Steps S402 to S406 have been provided in the preceding paragraphs, and will not be repeated here for brevity.

While in the embodiments in FIGS. 1 to 4, two controllers and/or two memory dies share a single resistor Rzq to perform the ZQ calibration, those skilled in the art would recognize that other numbers of controllers and/or memory dies can share a single resistor Rzq to achieve calibrations of all the controller and/or all the memory dies without deviating from the principle of the invention.

The embodiments in FIGS. 1 to 4 allow a plurality of controllers and/or a plurality of memory dies to share the resistor Rzq for calibration of output drivers and termination resistors thereof, reducing the number of resistors Rzq, reducing the circuit area and reducing the manufacturing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device comprising:
a resistor coupled between a connection terminal and a ground terminal; and
a controller chip comprising:
a first controller configured to transmit a first controller calibration request;
a second controller configured to transmit a second controller calibration request;

a first set of input/output (I/O) circuits coupled to the first controller;
a second set of I/O circuits coupled to the second controller;
a first calibration circuit coupled to the connection terminal and the first set of I/O circuits, and configured to perform a first controller calibration on the first set of I/O circuits using the resistor;
a second calibration circuit coupled to the connection terminal and the second set of I/O circuits, and configured to perform a second controller calibration on the second set of I/O circuits using the resistor; and
an arbitration circuit coupled to the first controller, the second controller, the first calibration circuit and the second calibration circuit, and configured to instruct the first calibration circuit to perform the first controller calibration in response to the first controller calibration request, and instruct the second calibration circuit to perform the second controller calibration in response to the second controller calibration request, wherein a first period of the first calibration circuit performing the first controller calibration and a second period of the second calibration circuit performing the second controller calibration are non-overlapping.

2. The memory device of claim 1, wherein the arbitration circuit is configured to receive the second controller calibration request during the first period, and instruct the second calibration circuit to perform the second controller calibration in response to the second controller calibration request upon completion of the first period.

3. The memory device of claim 1, wherein a length of the first period and a length of the second period are equal to a predetermined time length.

4. The memory device of claim 1, wherein the first calibration circuit is further configured to report a time required for the first controller calibration to the arbitration circuit upon receiving an instruction of performing the first controller calibration.

5. The memory device of claim 1, further comprising:
a memory chip coupled to the first set of I/O circuits, the second set of I/O circuits and the connecting terminal, including:
a first memory die coupled to the connection terminal and the first set of I/O circuits, and configured to perform a first memory calibration on the first memory die using the resistor; and
a second memory die coupled to the connection terminal and the second set of I/O circuits, and configured to perform a second memory calibration on the second memory die using the resistor;
wherein the first controller is further configured to transmit a first memory calibration request; and
the arbitration circuit is configured to instruct the first memory die via the first controller to perform the first memory calibration in response to the first memory calibration request in a third period, the first period, the second period and the third period being non-overlapping.

6. A method of controlling a memory device, the memory device comprising a resistor and a controller chip, the resistor being coupled between a connection terminal and a ground terminal, the controller chip comprising a first controller, a second controller, a first set of input/output (I/O) circuits, a second set of I/O circuits, a first calibration circuit, a second calibration circuit and an arbitration circuit, the first set of I/O circuits being coupled to the first controller, the second set of I/O circuits being coupled to the second controller, the first calibration circuit being coupled to the connection terminal and the first set of I/O circuits, the second calibration circuit being coupled to the connection terminal and the second set of I/O circuits, the arbitration circuit being coupled to the first controller, the second controller, the first calibration circuit and the second calibration circuit, the control method comprising:
the first controller transmitting a first controller calibration request;
the second controller transmitting a second controller calibration request; and
the arbitration circuit instructing the first calibration circuit to perform a first controller calibration on the first set of I/O circuits using the resistor in response to the first controller calibration request, and instructing the second calibration circuit to perform a second controller calibration on the second set of I/O circuits using the resistor in response to the second controller calibration request,
wherein a first period of the first calibration circuit performing the first controller calibration and a second period of the second calibration circuit performing the second controller calibration are non-overlapping.

7. The method of claim 6, further comprising:
the arbitration circuit receiving the second controller calibration request during the first period;
wherein instructing the second calibration circuit to perform the second controller calibration on the second set of I/O circuits using the resistor in response to the second controller calibration request comprises:
instructing the second calibration circuit to perform the second controller calibration upon completion of the first period.

8. The method of claim 6, wherein a length of the first period and a length of the second period are equal to a predetermined time length.

9. The method of claim 6, further comprising: the first calibration circuit reporting a time required for the first controller calibration to the arbitration circuit upon receiving an instruction of performing the first controller calibration.

10. The method of claim 6, wherein
the memory device further comprises a memory chip coupled to the first set of I/O circuits, the second set of I/O circuits and the connection terminal, comprising a first memory chip and a second memory chip, the first memory die being coupled to the connection terminal and the first set of I/O circuits, the second memory die being coupled to the connection terminal and the second set of I/O circuits, and
the method further comprises:
the first controller transmitting a first memory calibration request to perform a first memory calibration; and
the arbitration circuit instructing the first memory die via the first controller to perform the first memory calibration in response to the first memory calibration request in a third period, the first period, the second period and the third period being non-overlapping.

* * * * *